United States Patent
Weber

(10) Patent No.: US 10,827,628 B2
(45) Date of Patent: Nov. 3, 2020

(54) ASSEMBLY FOR CONNECTING A FLAT BODY TO A VOLTAGE SUPPLY WITH AN EMBEDDED CONTROL UNIT

(71) Applicant: SAINT-GOBAIN GLASS FRANCE, Courbevoie (FR)

(72) Inventor: Patrick Weber, Alsdorf (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 114 days.

(21) Appl. No.: 15/780,426

(22) PCT Filed: Jan. 24, 2017

(86) PCT No.: PCT/EP2017/051347
§ 371 (c)(1),
(2) Date: May 31, 2018

(87) PCT Pub. No.: WO2017/186360
PCT Pub. Date: Nov. 2, 2017

(65) Prior Publication Data
US 2018/0359867 A1    Dec. 13, 2018

(30) Foreign Application Priority Data
Apr. 27, 2016   (EP) ..................................... 16167244

(51) Int. Cl.
*H05K 5/00* (2006.01)
*H05B 3/84* (2006.01)
(Continued)

(52) U.S. Cl.
CPC ..... *H05K 5/0017* (2013.01); *B32B 17/10036* (2013.01); *B60R 16/02* (2013.01);
(Continued)

(58) Field of Classification Search
CPC ..... H02J 1/00; H01F 1/00; H04B 1/00; H02P 1/00
See application file for complete search history.

(56) References Cited

U.S. PATENT DOCUMENTS

| 8,866,047 B1 | 10/2014 | Parker |
| 2006/0203879 A1 | 9/2006 | Ruttiger et al. |

(Continued)

FOREIGN PATENT DOCUMENTS

| DE | 10132963 C1 | 11/2002 |
| DE | 102011121921 A1 | 6/2013 |

(Continued)

OTHER PUBLICATIONS

International Search Report issued for International Patent Application No. PCT/EP2017/051347, filed Jan. 24, 2017 on behalf of Saint-Gobain Glass France, dated Mar. 29, 2017. 7 pages (English Translation + German Original).

(Continued)

*Primary Examiner* — Jermele M Hollington
*Assistant Examiner* — Temilade S Rhodes-Vivour
(74) *Attorney, Agent, or Firm* — Pillsbury Winthrop Shaw Pittman LLP

(57) ABSTRACT

An assembly for connecting a flat body to a voltage supply is presented. The assembly includes a ribbon cable, a control unit, and a connection element. A voltage supply supplies an electric voltage to the control unit. The flat body includes an electrically conductive structure, and a switching surface for generating a control signal that is received by the control unit. According to one aspect, the control unit is embedded in an insulating material between the flat body and the connection element. Also presented is a flat body with such an assembly, as well as a method for producing such an assembly.

14 Claims, 4 Drawing Sheets

Figure 1:
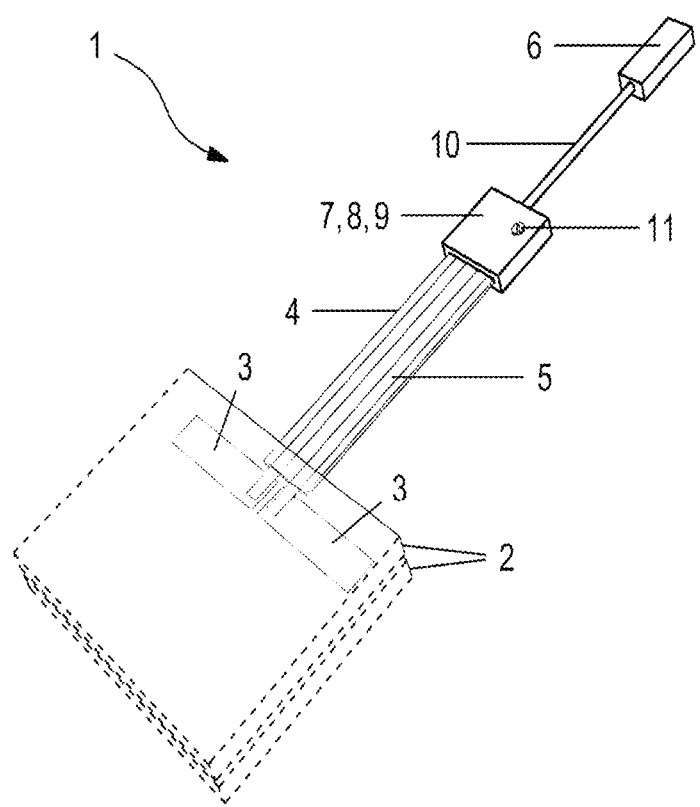

(51) Int. Cl.
    *B32B 17/10*     (2006.01)
    *B60R 16/02*     (2006.01)
    *G01D 5/24*     (2006.01)
    *H01B 7/08*     (2006.01)
    *H01R 12/77*     (2011.01)
    *H03K 17/96*     (2006.01)

(52) U.S. Cl.
    CPC ............ *G01D 5/2405* (2013.01); *H01B 7/08* (2013.01); *H01R 12/771* (2013.01); *H03K 17/962* (2013.01); *H05B 3/84* (2013.01); *H01R 2201/26* (2013.01); *H03K 2217/96078* (2013.01); *H03K 2217/960745* (2013.01); *H05B 2203/016* (2013.01)

(56) References Cited

U.S. PATENT DOCUMENTS

| | | | | |
|---|---|---|---|---|
| 2011/0012437 | A1* | 1/2011 | Hyde | H01B 17/525 307/149 |
| 2011/0012583 | A1* | 1/2011 | Hyde | H02J 3/16 323/355 |
| 2011/0174638 | A1* | 7/2011 | Katsuki | A61B 5/14503 205/792 |
| 2013/0042780 | A1* | 2/2013 | Brooks | F42B 3/13 102/202.7 |
| 2013/0224990 | A1 | 8/2013 | Reul et al. | |
| 2014/0233240 | A1* | 8/2014 | Reul | H03K 17/962 362/295 |
| 2016/0204535 | A1* | 7/2016 | Ye | H01R 13/17 439/66 |
| 2017/0041987 | A1 | 2/2017 | Weber et al. | |

FOREIGN PATENT DOCUMENTS

| | | |
|---|---|---|
| EP | 2669083 A1 | 12/2013 |
| JP | H11-298094 A | 10/1999 |
| JP | 2006-335115 A | 12/2006 |
| JP | 2007-505302 A | 3/2007 |
| JP | 2008-126969 A | 6/2008 |
| JP | 2008-256516 A | 10/2008 |
| JP | 2009-099335 A | 5/2009 |
| KR | 200220888 Y1 | 4/2001 |
| RU | 2289892 C2 | 12/2006 |
| WO | 03/069955 A1 | 8/2003 |
| WO | 2012/019893 A1 | 2/2012 |
| WO | 2015/162107 A1 | 10/2015 |

OTHER PUBLICATIONS

Written Opinion issued for International Patent Application No. PCT/EP2017/051347, filed Jan. 24, 2017 on behalf of Saint-Gobain Glass France, dated Mar. 29, 2017. 15 pages (English Translation + German Original).

Korean Office Action for Korean Application No. 1020187016498, dated Jan. 2019. 3 pages. English only.

Translation of Russian Office Action, Russian Application No. 2018123719/07(037612) dated Jun. 14, 2019. (English only). 3 pages.

Translation of Russian Search Report, Russian Application No. 2018123719/07(037612) dated Jun. 14, 2019. (English only). 2 pages.

Notice of Reasons for Refusal as issued in Japanese Patent Application No. 2018-540849, dated Jun. 26, 2020.

* cited by examiner

ASSEMBLY FOR CONNECTING A FLAT BODY TO A VOLTAGE SUPPLY WITH AN EMBEDDED CONTROL UNIT

CROSS REFERENCE TO RELATED APPLICATIONS

The present application is the U.S. national stage entry of International Patent Application No. PCT/EP2017/051347, filed internationally on Jan. 24, 2017, which, in turn, claims priority to European Patent Application No. 16167244.9, filed on Apr. 27, 2016.

The invention relates to an assembly for connecting a flat body to a voltage supply, having a ribbon cable, a control unit, and a connection element, wherein the voltage supply is provided at least to supply the control unit with an electric voltage and the flat body has an electrically conductive structure, a switching surface for generating a control signal, and the control unit is provided to receive the control signal.

Flat bodies, such as vehicle windows, are equipped with at least one electrically conductive structure, in order to offer additional functionality of the vehicle window. Additional functionality of the vehicle window can be electric pane heating or a rain sensor system integrated into the vehicle window. In living spaces, flat bodies are known as heaters on walls or as heatable mirrors.

To control the functionality, the flat body has a switching surface via which a user can control the functionality. These switching surfaces can be implemented as capacitive switching surfaces (touch control) in the form of line or surface electrodes. By touching the switching surface, a control signal is generated that is transmitted via an electrical connection to a control unit. The control unit then executes a function dependent on the control signal.

EP 2669083 A1 describes a flat body with a connection module that electrically connects an electrically conductive structure of the flat body to an external electrical connection. The connection module comprises a ribbon cable with a flat strip conductor that is made of an electrically conductive material and is surrounded by a sheath made of an electrically insulating material. The flat strip conductor is electrically connected to the electrically conductive structure of the flat body on one end and to a round conductor on its other end.

This connection of the flat strip conductor on the round conductor forms a connection zone that is embedded in a sealing compound composite surrounded by a connection housing. The round conductor culminates in a connection element, for example, an electrical plug.

For reasons of physics, flat strip conductors and round conductors generate undesirable parasitic losses. These losses are created by a capacitive coupling with the surroundings and are also referred to as so-called parasitic capacitance. The parasitic capacitance can generate an unwanted switching signal of the switching surface.

The object of the present invention consists in providing an improved assembly for connecting a flat body to a voltage supply that has a reduction in the parasitic losses.

The object of the present invention is accomplished according to the invention by an assembly for connecting a flat body to a voltage supply as well as a flat body with an assembly in accordance with the various embodiments disclosed in the present application.

A method according to the invention for producing the assembly is also disclosed.

The present invention comprises an assembly for connecting a flat body to a voltage supply, having a ribbon cable, a control unit, and a connection element. The voltage supply is provided at least to supply the control unit with an electric voltage. The flat body has an electrically conductive structure and a switching surface for generating a control signal. The control unit is provided to receive the control signal and is embedded in an insulating material between the flat body and the connection element.

Such assemblies have shortened wiring between the capacitive sensitive flat body and the voltage supply such that the switching surface is well protected against parasitic capacitances of the wiring.

The flat body can include materials such as glass or plastic and be implemented as a single pane glass or as a composite pane with two single panes fixedly bonded to one another by a thermoplastic adhesive film. By way of example, the flat body can be a composite pane with an electric heating apparatus or an antenna conductor.

The electrically conductive structure of the flat body can be electrically connected to a voltage supply via the ribbon cable and the connection element. The term "ribbon cable" means, according to the invention, a single- or multi-wire cable. The ribbon cable has a plurality of flat strip conductors that are held parallel to one another at a distance along the ribbon cable by a sheath made of insulating material (e.g., polyamide or Kapton). A flat strip conductor can, for example, be a tape or strip-shaped conductor made of metal foil with a very low layer thickness in the single- or double-digit micron range.

A functionality of the flat body can be controlled via the switching surface of the flat body by touching the switching surface. Such switching surfaces can be implemented as a line or surface electrode or as capacitive switching surfaces by two coupled electrodes and operate according to so-called "touch control" technology. For example, the electric heating apparatus of the flat body is controlled via this switching surface.

When an object, preferably a human finger, approaches the switching surface, the capacitance of the electrodes changes due to the electrical charge of the object. The capacitance change causes a charge transport such that an electric current flows and, by this means, a control signal of the control unit can be generated. The control signal can be a switching signal to switch the heating apparatus on or off.

The control unit is provided to receive the control signal. The control unit is preferably a microchip (IC), which can be arranged on an electronic board (PCB). Such electronic boards can have an additional electronic components. The control unit preferably includes a sensor electronics system, in particular a capacitive sensor electronic system for controlling the functionality of the flat body.

A sensitivity of the sensor electronic system is set such that the sensor electronic system outputs a control signal upon touching of the switching region by one or a plurality of human fingers. The term "touching of the switching region" can also mean any other type of interaction with the switching region that generates a change in the capacitance. Preferably, the control signal is triggered only by the touching of a substrate side of the flat body.

The control unit is embedded in an insulating material between the flat body and the connection element. Such assemblies have physical proximity of the control unit and the flat body and thus a short, fixed length of the ribbon cable. Thus, advantageously, the parasitic capacitances of the switching surface can be decoupled and losses reduced. The setting of the sensitivity of the switching surface is thus simplified.

Advantageously, subsequent adjustment of the sensitivity of the switching surface due to line length fluctuations can be eliminated in the case of low losses.

Preferably, the assembly has a housing with a line connection between an electrical conductor and a flat strip conductor running in the ribbon cable, with the control unit arranged in the housing. A further improvement of the assembly is demonstrated by the fact that the control unit forms a stable connection with the flat body.

Such housings are made of plastic, for example, polyimide, and include, in the interior, an insulating material having a polymeric material. The insulating material has properties that shield the control unit against the external environment in an air- and watertight manner.

Preferably, the housing includes a setting means for adjusting a sensitivity of the control unit. Such setting means are provided to change an internal comparative capacitance of the control unit. A reason for changing the comparative capacitance can be a changed design of the electrodes in the switching surface.

The setting means is, for example, a connecting element, e.g., a screw, the head of which can be arranged readily accessible from outside the housing. Alternatively to the screw, the setting means can be on the housing as an additional flat strip conductor running in parallel or as a connector (terminal).

In another advantageous embodiment of the invention, the connection element can be provided to network the flat body in a vehicle or device. The connection element can thus be a serial interface of a bus system, for example, a CAN bus system, of the vehicle.

In another advantageous embodiment of the assembly according to the invention, the control unit is arranged at least partially in the ribbon cable. In particular, the control unit is embedded in the insulating material of the ribbon cable. In this case, the control unit is directly contacted electrically at least with a flat strip conductor.

The insulating material of the ribbon cable can be made of plastic, e.g., polyimide.

By means of such an assembly, it was possible to reduce the number of special (OEM-specific) connection elements, which must specifically fit an installation environment of the flat body, to one connection element.

Advantageously, the control unit has a setting means for adjusting a sensitivity of the control unit. The setting means can be a capacitor, whose capacitance can be adapted to the geometric design of the flat strip conductor and of the electrically conductive structure.

In addition, the invention relates to a flat body with an assembly for connecting to a voltage supply of a vehicle having a ribbon cable, a control unit, and a connection element, wherein the voltage supply is provided at least to supply the control unit with an electric voltage and the flat body has an electrically conductive structure and a switching surface for generating a control signal and the control unit is provided to receive the control signal. The control unit is embedded in an insulating material between the flat body and the connection element.

Such a flat body takes up very little space during storage, during transport of the flat body, and in the installed state in a vehicle or device.

The invention also relates to a method for producing an assembly, in which the control unit is embedded in an insulating material between the flat body and the connection element and can thus be implemented dustproof and watertight.

In an advantageous embodiment of the method, an electrical conductor is electrically conductingly connected to a flat strip conductor running in the ribbon cable. The connection between the conductor and the flat strip conductor as well as the control unit are arranged and secured in a housing. The housing is cast along with the insulating material. Alternatively, a protective coating can be applied to the control unit before casting with insulating material.

Advantageously, the housing is formed from two half shells. A first half shell filled with the insulating material is provided to accommodate the conductor connected to the flat strip conductor and the control unit. In another process step, a second half shell is placed on the first half shell such that a box-shaped housing is formed by the first and second half shell.

It is also conceivable, in a first process step, for the connection between the conductor and the flat strip conductor as well as the control unit to be encased by the insulating material and, in a second process step, to be accommodated by an encapsulating, integrally molded housing in the interior of the housing.

In another advantageous embodiment of the method, the control unit is at least partially embedded in the insulating material of the ribbon cable. Preferably, the control unit is embedded by lamination in the insulating material of the ribbon cable.

In addition, the control unit can be encased by another layer. This layer is preferably a flexible film made of an electrically conductive material, which advantageously protects the control unit against damage. The film can, furthermore, at least partially encase the control unit and advantageously influence the electromagnetic compatibility (EMC) of the assembly.

Figure 2:
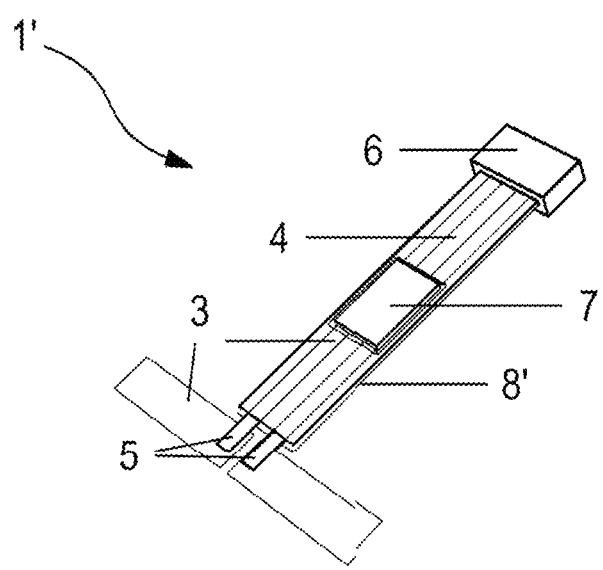
Figure 3:
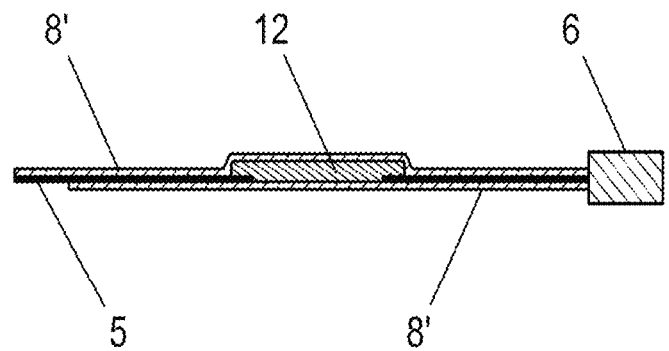
Figure 4:
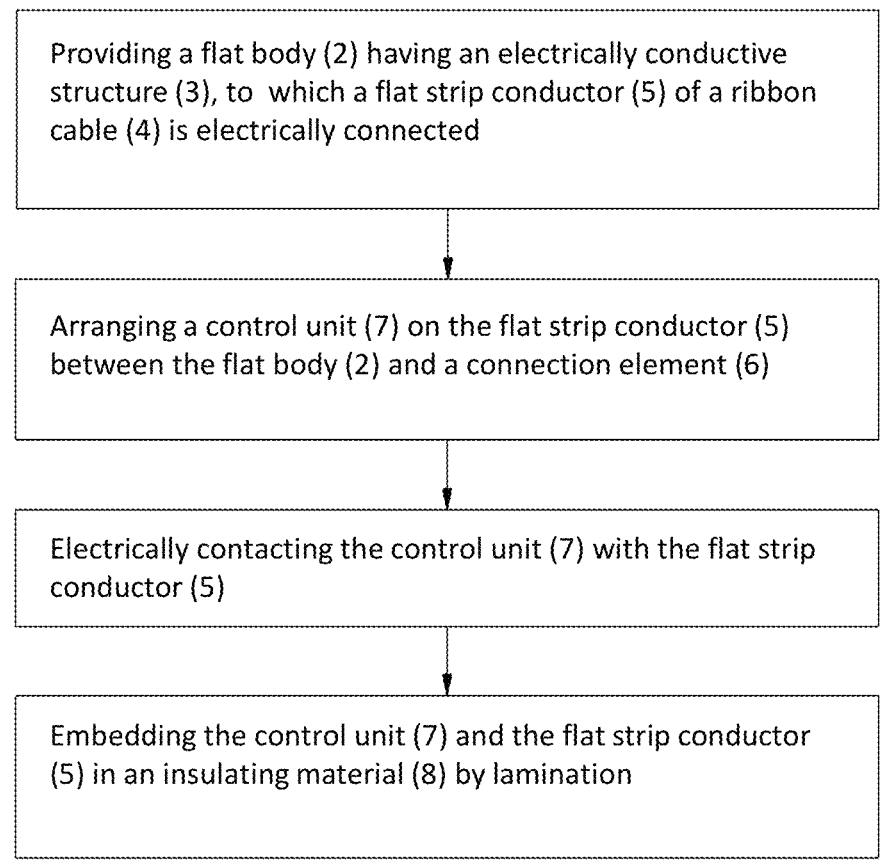

The invention is explained in detail with reference to figures and exemplary embodiments. They depict:

FIG. 1 a schematic view of a first embodiment of an assembly for connecting a flat body FIG. 2 a schematic view of a second embodiment of an assembly for connecting a flat body FIG. 3 a cross-section of a ribbon cable with an embedded control unit FIG. 4 a flowchart of an exemplary method for producing an assembly according to the invention, wherein a control unit is embedded in an insulating material of a ribbon cable.

FIG. 1 depicts a first embodiment of an assembly 1 for connecting a flat body to a voltage supply. The flat body is a composite pane 2 that is formed from two single panes. The single panes are fixedly bonded to one another by a thermoplastic adhesive film. The single panes are preferably made of glass; alternatively, the single panes can be produced from a non-glass material, for example, from plastic.

The composite pane 2 has an electric heating apparatus or another functionality of the composite pane 2, which is powered via an electrically conductive structure with an appropriate voltage supply for operation of the composite pane 2. The electrically conductive structure is integrated in the form of a plurality of busbars in the composite pane 2. Furthermore, the composite pane 2 has a switching surface integrated in the composite pane, which can be formed from the same conductive structure as that of the heating function, via which, for example, the heating apparatus can be controlled.

The switching surface and the heating apparatus are separated from one another on the composite pane both electrically and visually. The switching surface can be operated with a voltage supply customary for vehicles of, for example, 12 V or 48 V (onboard power), with the heating apparatus to be supplied with an appropriate heating voltage.

Such switching surfaces can be implemented as a line or a surface electrode or as two coupled electrodes as capacitive surfaces and operate according to the so-called "touch control" technology. The switching surface is preferably situated at the outer edge of the composite pane 2, not far from one of the busbars and, in the case of a heating application, preferably lies along the direction of the current, in order not to affect the homogeneity of a heating layer.

When an object, preferably a human finger or an element with similar permittivity properties, approaches the switching surface, the capacitance of the electrodes changes due to the electrical charges of the object. The change in capacitance causes a charge transport. An electrical current flows and generates a control signal. The control signal is a switching signal that can control, for example, a turning on or off of the heating apparatus.

The control signal is forwarded via an electrical line connection 3 to a control unit 7. For this, the switching surface is electrically conductingly connected to a flat strip conductor 5 of a two-wire ribbon cable 4. A flat strip conductor 5, also called a foil conductor or a flat conductor, means an electrical conductor whose width is significantly greater than its thickness. The flat strip conductor 5 is electrically insulated with an insulating material 8, for example, a polyimide layer and routed outward as a ribbon cable 4 over the edge of the composite pane 2.

The ribbon cable 4 ends in a housing 9, in which the flat strip conductor 5 is electrically connected to a conductor, for example, a round conductor 10. In the housing 9, the control unit 7 is also arranged and electrically contacted with the flat strip conductor 5 or round conductor 10 such that the control unit 7 can receive the control signal generated on the switching surface. The housing 9 is filled at least partially with an insulating material, in which the control unit 7 is embedded.

The control unit 7 is preferably a capacitive sensor electronics system for controlling the touch control technology. The sensor electronics system can be a microchip that is arranged on an electronic board (PCB) 12 as depicted in FIG. 3. Such electronic boards can also have additional electronic components.

The housing 9 has a screw 11 or any other connecting element that serves as a setting means for adjusting a sensitivity of the control unit 7. A screw head of the screw 11 is readily accessible from the outside on the housing surface. In this manner, an adjustment of the sensitivity of the control unit 7 can be undertaken even while the housing is closed.

The round conductor 10 is routed out of the housing 9 via an opening and is electrically connected on its second end to a connection element 6.

The connection element is provided to contact the composite pane 2 in a vehicle electronic system. The connection element is vehicle-specific or designed as a plug to fit a bus system of the vehicle as a plug. For example, the connection element can be a serial interface of a CAN bus system of the vehicle.

FIG. 2 depicts a second embodiment of an assembly 1' for connecting a flat body. Analogously with the embodiment in FIG. 1, the composite pane 2 has an electric heating apparatus that is electrically contacted via the busbars with the voltage supply. The composite pane 2 further has an integrated switching surface, via which the heating apparatus or any other functionality can be controlled. For this, the switching surface is electrically conductingly connected to the flat strip conductor 5.

In contrast to the exemplary embodiment of FIG. 1, the assembly 1' in FIG. 2 has no housing 9 in which the control unit 7 could be accommodated. The control unit 7 is further electrically contacted with the flat strip conductor 5. In the second exemplary embodiment, the control unit 7 is embedded in the insulating material 8 of the ribbon cable 4.

The ribbon cable 4 ends with the connection element 6, which is, in turn, implemented as a plug that fits in the installation environment of a vehicle.

FIG. 3 depicts a cross-section of the ribbon cable 4 of FIG. 2 with an embedded control unit 7. The ribbon cable 4 has on its first end a sheath-free region of the flat strip conductor 5. This region serves for contacting the flat strip conductor 5 to a contact point of the sensitive structure of the composite pane 2.

The flat strip conductor 5 is, in its further course between its first end that is contacted with the line connection 3 of the composite pane 2 and its second end, electrically contacted with the control unit 7 embedded in the insulating material 8. The ribbon cable 4 ends on its second end in the connection element 6 that serves as a plug for connecting to the installation environment of the vehicle.

FIG. 4 depicts a flowchart of an exemplary method for producing an assembly 1' according to the invention, wherein, in a first step, a flat body 2 having an electrically conductive structure 3 is provided and to which a flat strip conductor 5 of a ribbon cable 4 is electrically connected.

In the second step, a control unit 7 is arranged on the flat strip conductor 5 between the flat body 2 and the connection element 6. In a third step, the control unit 7 is contacted with the flat strip conductor 5. In a further step, the control unit 7 and the flat strip conductors 5 are embedded in the insulating material 8'. The control unit 7 is placed by lamination in the insulating material of the ribbon cable.

In addition, the control unit 7 can be encased by another layer. The layer is preferably a flexible film made of an electrically conductive material.

LIST OF REFERENCE CHARACTERS

1 a first embodiment of an assembly
1' a second embodiment of the assembly
2 composite pane
3 line connection
4 ribbon cable
5 flat strip conductor
6 connection element
7 control unit
8 insulating material
8' insulating material of the ribbon cable
9 housing
10 electrical round conductor
11 screw
12 electronic board

The invention claimed is:
1. An assembly for connecting a flat body to a voltage supply, the assembly comprising:
   a ribbon cable;
   a control unit; and
   a connection element,
      wherein the control unit is embedded in an insulating material between a flat body and the connection element, wherein the flat body comprises an electrically conductive structure and a capacitive switching surface for generating a control signal,
wherein the control unit is configured to receive the control signal, and
wherein the control unit is supplied with an electric voltage by a voltage supply
further comprising a housing having a line connection between a round electrical conductor and a flat strip conductor running in the ribbon cable and wherein the control unit is arranged inside the housing.

2. The assembly according to claim 1, wherein the housing comprises a setting means for adjusting a sensitivity of the control unit.

3. The assembly according to claim 1, wherein the connection element is provided to network the flat body in a vehicle.

4. The assembly according to claim 3, wherein the connection element is a serial interface of a bus system of the vehicle.

5. The assembly according to claim 1, wherein the control unit is arranged, at least partially, in the ribbon cable.

6. The assembly according to claim 5, wherein the control unit is embedded, at least partially, in an insulating material of the ribbon cable.

7. The assembly according to claim 5, wherein the control unit comprises a setting means for adjusting a sensitivity of the control unit.

8. The assembly according to claim 7, wherein the setting means comprises a capacitor.

9. The assembly according to claim 1, wherein the control unit comprises an electronic board comprising at least one electronic component and a connecting interface.

10. An apparatus for connecting to a voltage supply of a vehicle, comprising: an assembly according to claim 1, wherein the control unit of the assembly is supplied with an electric voltage by a voltage supply of a vehicle.

11. A method for producing an assembly, the method comprising:
embedding a control unit in an insulating material between a flat body and a connection element,
thereby producing an assembly,
wherein the assembly comprises
a ribbon cable,
the control unit, and
the connection element,
wherein the flat body comprises
an electrically conductive structure, and
a capacitive switching surface for generating a control signal, wherein the control unit is configured to receive the control signal, and wherein the control unit is supplied with an electric voltage by a voltage supply.

12. The method according to claim 11, further comprising: connecting an electrical conductor to a flat strip conductor running in the ribbon cable, thereby producing an electrical connection between the electrical conductor and the flat strip conductor; arranging and securing, in a housing, the electrical connection and the control unit; and casting the housing with the insulating material.

13. The method according to claim 11, wherein the control unit is at least partially embedded in insulating material of the ribbon cable.

14. The method according to claim 11, wherein the control unit is embedded by lamination in the insulating material of the ribbon cable.

* * * * *